(12) United States Patent
Nagamori

(10) Patent No.: US 10,840,858 B2
(45) Date of Patent: Nov. 17, 2020

(54) POWER AMPLIFIER CIRCUIT AND HIGH-FREQUENCY MODULE

(71) Applicant: Murata Manufacturing Co., Ltd., Kyoto (JP)

(72) Inventor: Hiroyuki Nagamori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/891,904

(22) Filed: Feb. 8, 2018

(65) Prior Publication Data

US 2018/0226923 A1    Aug. 9, 2018

(30) Foreign Application Priority Data

Feb. 9, 2017   (JP) ................ 2017-022155

(51) Int. Cl.
| | |
|---|---|
| H03F 1/30 | (2006.01) |
| H03F 3/193 | (2006.01) |
| H03F 1/02 | (2006.01) |
| H03F 3/24 | (2006.01) |
| H03F 1/56 | (2006.01) |
| H03F 3/195 | (2006.01) |
| H03F 1/32 | (2006.01) |

(52) U.S. Cl.
CPC .......... *H03F 3/193* (2013.01); *H03F 1/0227* (2013.01); *H03F 1/3223* (2013.01); *H03F 1/56* (2013.01); *H03F 3/195* (2013.01); *H03F 3/245* (2013.01); *H03F 2200/102* (2013.01); *H03F 2200/411* (2013.01); *H03F 2200/451* (2013.01); *H03F 2200/516* (2013.01)

(58) Field of Classification Search
CPC . H03F 3/193; H03F 3/195; H03F 1/56; H03F 3/245; H03F 1/0227; H03F 1/3223
USPC ................ 330/277, 136, 127, 133, 296, 207
See application file for complete search history.

(56) References Cited

U.S. PATENT DOCUMENTS

| | | | |
|---|---|---|---|
| 7,616,060 B2 * | 11/2009 | Yamamoto ........... | H03G 1/0052 330/284 |
| 2002/0017954 A1 * | 2/2002 | Hau .................... | H03F 1/32 330/149 |
| 2005/0110572 A1 * | 5/2005 | Morimoto ........... | H03F 3/19 330/294 |
| 2007/0252651 A1 * | 11/2007 | Gao .................... | H03F 1/56 330/302 |

(Continued)

FOREIGN PATENT DOCUMENTS

| | | |
|---|---|---|
| JP | 2000-357746 A | 12/2000 |
| JP | 2002-223127 A | 8/2002 |
| WO | 2013176147 A1 | 11/2013 |

*Primary Examiner* — Khanh V Nguyen
*Assistant Examiner* — Khiem D Nguyen
(74) *Attorney, Agent, or Firm* — Pearne & Gordon LLP

(57) ABSTRACT

A power amplifier circuit includes an amplifier element that amplifies a signal input to a base and outputs an amplified signal from a collector, and a variable capacitor provided between the base and the collector of the amplifier element. A power-supply voltage that varies in accordance with an envelope of amplitude of a radio-frequency signal is applied to the collector of the amplifier element, and capacitance of the variable capacitor decreases in response to an increase in the power-supply voltage input to the collector of the amplifier element.

11 Claims, 7 Drawing Sheets

(56) References Cited

U.S. PATENT DOCUMENTS

2013/0207730 A1* 8/2013 Lee .................. H01L 29/93
330/296
2014/0285261 A1* 9/2014 Dakshinamurthy .... H03F 1/025
330/127

* cited by examiner

POWER AMPLIFIER CIRCUIT AND HIGH-FREQUENCY MODULE

This application claims priority from Japanese Patent Application No. 2017-022155 filed on Feb. 9, 2017. The content of this application is incorporated herein by reference in its entirety.

BACKGROUND

The present disclosure relates to a power amplifier circuit and a high-frequency module. In recent years, as a technique for realizing increased efficiency of power amplifier circuits, there is an envelope tracking technique. The envelope tracking technique is a high-frequency amplification technique in which the amplitude of a power-supply voltage is changed in accordance with the amplitude of an envelope of an input signal. More specifically, in this technique, a drain voltage of an amplifier element is changed in accordance with an output voltage, thereby reducing power loss that occurs during operation with a fixed voltage and achieving increased efficiency (see International Publication No. 2013/176147, for example).

For example, in the case of a signal with a high peak-to-average power ratio (PAPR), such as a modulation signal in wideband code division multiple access (W-CDMA), the amplifier element is operated with a fixed voltage, thereby resulting in low efficiency during average power periods. On the other hand, in the envelope tracking technique, a drain voltage of the amplifier element is changed in accordance with output power, thereby enabling increased efficiency both during average power periods and during peak power periods.

A power amplifier circuit disclosed in International Publication No. 2013/176147 includes a transistor that amplifies a signal input to a base and outputs the amplified signal from a collector, and a capacitor provided between the base and the collector of the transistor and having a capacitance value that has a lower dependence on voltage than the base-collector parasitic capacitance of the transistor.

In the power amplifier circuit according to the related art, a deviation in the gain of high-frequency power (gain deviation) between a low power-supply voltage and a high power-supply voltage is small in a linear gain region in which gain is substantially constant, and a power-supply control signal (envelope signal) during envelope tracking does not exhibit linearity with respect to the power-supply voltage. Thus, even when the power-supply voltage is increased, the gain cannot be increased, and power efficiency cannot be improved.

BRIEF SUMMARY

In view of the above-described issues, the present disclosure provides a power amplifier circuit and a high-frequency module that each enables improvements in the linearity of high-frequency power gain and power efficiency.

A power amplifier circuit according to an embodiment of the present disclosure includes an amplifier element configured to amplify a radio-frequency signal input to a base and to output an amplified radio-frequency signal from a collector, and a variable capacitor provided between the base and the collector of the amplifier element. A power-supply voltage that varies in accordance with an envelope of amplitude of the radio-frequency signal is supplied to the collector of the amplifier element, and a capacitance value of the variable capacitor decreases when the power-supply voltage is increased.

Thus, in the power amplifier circuit, a gain deviation in high-frequency power between a low power-supply voltage and a high power-supply voltage can be increased in a linear gain region, and the linearity of a power-supply control signal (envelope signal) during envelope tracking can be improved. Hence, in the power amplifier circuit, the linearity of high-frequency power gain and power efficiency can be improved.

Furthermore, the power amplifier circuit may further include a resistor connected in series with the variable capacitor.

Thus, when the resistor is connected in series with the variable capacitor, the amount of negative feedback applied to the amplifier element can be finely adjusted. Hence, variations in the gain of high-frequency power due to variations in power-supply voltage can be finely adjusted.

Furthermore, the variable capacitor may be a diode, an anode of the diode may be connected to the base of the amplifier element, and a cathode of the diode may be connected to the collector of the amplifier element.

Thus, in response to an increase in the power-supply voltage applied to the collector of the amplifier element, a capacitance value of the diode automatically decreases. Hence, the gain of the power amplifier circuit can be automatically adjusted by the power-supply voltage. Thus, a gain deviation in the linear gain region is easily adjusted, and the linearity of a power-supply control signal (envelope signal) during envelope tracking can be improved. Hence, the linearity of high-frequency power gain and power efficiency can be easily improved.

Furthermore, the power amplifier circuit may include multiple stages of the amplifier elements connected in series, and the variable capacitor may be connected between a base and a collector of an amplifier element to which the radio-frequency signal is first input among the multiple stages of the amplifier elements.

Thus, the gain of an amplified radio-frequency signal output from the power amplifier circuit can be increased further, and the linearity of the radio-frequency signal can be enhanced. Furthermore, when the variable capacitor is provided in a first-stage amplifier element to which the radio-frequency signal is first input among the multiple stages of the amplifier elements, a gain deviation in the linear gain region can be efficiently adjusted.

Furthermore, a high-frequency module according to an embodiment of the present disclosure includes the power amplifier circuit having the above-described features, and a radio-frequency integrated circuit (RFIC) configured to output a radio-frequency signal to the power amplifier circuit.

Thus, a gain deviation in the linear gain region can be increased, and the high-frequency module can be provided in which an improvement in the linearity of a power-supply control signal (envelope signal) during envelope tracking has been achieved. Hence, in the high-frequency module, the linearity of high-frequency power gain and power efficiency can be improved.

Furthermore, the high-frequency module may further include a control circuit configured to control the power-supply voltage.

Thus, since the control circuit controls the power-supply voltage, the linearity of a power-supply control signal (envelope signal) is simply improved in accordance with envelope tracking, and the linearity of high-frequency power gain and power efficiency can be improved.

Furthermore, the control circuit may be an envelope tracking circuit configured to generate the power-supply voltage that varies in accordance with an envelope of amplitude of the radio-frequency signal.

Thus, since the envelope tracking circuit directly supplies the power-supply voltage, the linearity of a power-supply control signal (envelope signal) during envelope tracking is more appropriately improved, and the linearity of high-frequency power gain and power efficiency can be efficiently improved.

According to the embodiments of the present disclosure, the power amplifier circuit and the high-frequency module can be provided that each enables improvements in the linearity of high-frequency power gain and power efficiency.

Other features, elements, and characteristics of the present disclosure will become more apparent from the following detailed description of embodiments of the present disclosure with reference to the attached drawings.

DETAILED DESCRIPTION

Figure 1:
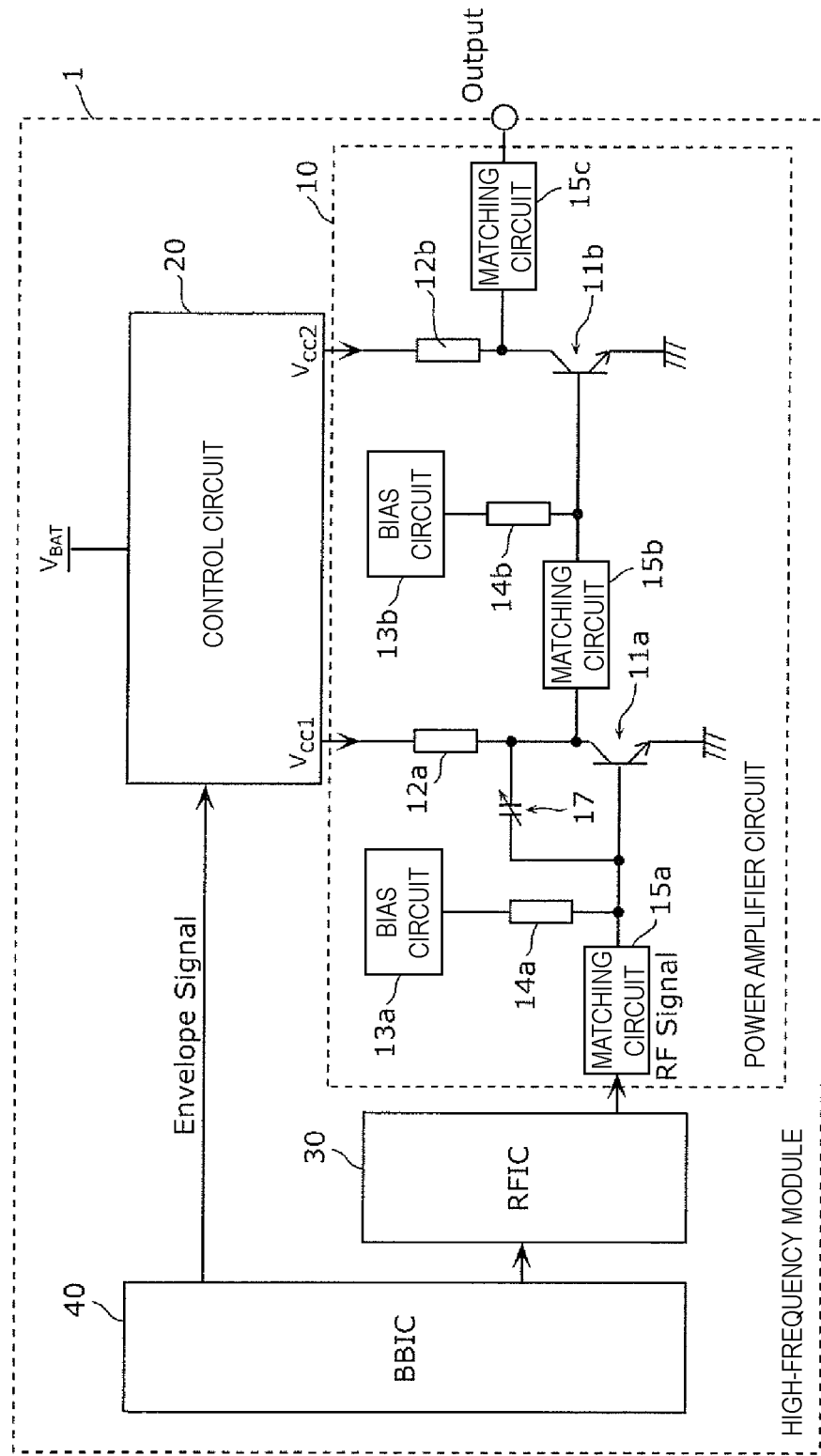
FIG. 1 is a conceptual diagram illustrating a configuration of a high-frequency module according to a first embodiment.

Embodiments of the present disclosure will be described below. Note that the embodiments described below each describe a specific example of the present disclosure. Thus, numerical values, shapes, materials, components, the placement and connection configuration of the components, and so forth that are described in the following embodiments are merely examples and are not intended to limit the present disclosure. Hence, among the components in the following embodiments, a component not described in an independent claim describing the most generic concept of the present disclosure is described as an optional component.

Furthermore, each of the figures is a schematic diagram and is not necessarily drawn precisely. In the figures, components that are substantially the same are denoted by the same reference numerals, and repeated descriptions thereof are omitted or simplified.

First Embodiment

A first embodiment will be described below with reference to FIG. 1.

1. Configuration of High-Frequency Module

First, configurations of a high-frequency module 1 and a power amplifier circuit 10 according to this embodiment will be described. FIG. 1 is a conceptual diagram illustrating a configuration of the high-frequency module 1 according to this embodiment. FIG. 2 illustrates the relationship between power-supply voltage and a radio-frequency signal in an envelope tracking technique.

Figure 2:
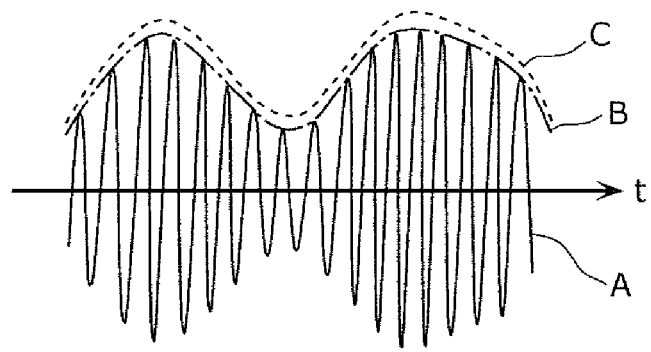
FIG. 2 illustrates the relationship between power-supply voltage and a radio-frequency signal in an envelope tracking technique.

As illustrated in FIG. 1, the high-frequency module 1 includes the power amplifier circuit 10, a control circuit 20, a radio-frequency integrated circuit (RFIC) 30, and a baseband integrated circuit (BBIC) 40. An antenna (not illustrated) is connected to an output terminal (Output) of the high-frequency module 1.

The power amplifier circuit 10 is an amplifier circuit that amplifies the power of a radio-frequency (RF) signal output from the RFIC 30 to a level necessary to transmit the signal to a base station and outputs the amplified signal.

In the power amplifier circuit 10, a radio-frequency signal is amplified using an envelope tracking technique. In the envelope tracking technique, as illustrated in FIG. 2, from a modulated radio-frequency signal (waveform A illustrated in FIG. 2), an envelope (waveform B illustrated in FIG. 2) of its amplitude is extracted as amplitude information. Power-supply voltages $V_{cc1}$ and $V_{cc2}$ (waveform C illustrated in FIG. 2) are supplied to transistors 11a and 11b each serving as an amplifier element. At this time, the power-supply voltages $V_{cc1}$ and $V_{cc2}$ vary in accordance with the envelope, thereby enabling the transistors 11a and 11b to operate in a state close to a saturation state. A configuration of the power amplifier circuit 10 will be described later.

The control circuit 20 is a control circuit that controls voltage values of the power-supply voltages $V_{cc1}$ and $V_{cc2}$ and supplies the power-supply voltages $V_{cc1}$ and $V_{cc2}$ to the power amplifier circuit 10. More specifically, the control circuit 20 is an envelope tracking circuit that generates power-supply voltages $V_{cc1}$ and $V_{cc2}$ that vary in accordance with an envelope of the amplitude of a radio-frequency signal output from the BBIC 40, and supplies the generated power-supply voltages $V_{cc1}$ and $V_{cc2}$ to the power amplifier circuit 10. The control circuit 20 is constituted by a direct current to direct current (DC-DC) converter, for example, and generates power-supply voltages $V_{cc1}$ and $V_{cc2}$ at a level corresponding to an envelope from an input voltage.

Furthermore, the control circuit 20 is connected to a battery (not illustrated) of, for example, a terminal or the like into which the high-frequency module 1 is incorporated, and a battery voltage $V_{BAT}$ is supplied from the battery. As illustrated in FIG. 2, the control circuit 20 extracts an envelope (waveform B illustrated in FIG. 2) from a modulation signal (waveform A illustrated in FIG. 2) of a radio-frequency signal, generates power-supply voltages $V_{cc1}$ and $V_{cc2}$ at a level corresponding to the envelope, and supplies the power-supply voltages $V_{cc1}$ and $V_{cc2}$ to the power amplifier circuit 10.

The control circuit 20 may serve as a component of the power amplifier circuit 10. That is, the power amplifier circuit 10 may include the control circuit 20.

The RFIC 30 is an integrated circuit that includes most of the elements of a high-frequency analog transceiver circuit and a corresponding control circuit necessary for mobile communication devices except for a duplexer, a transmission power amplifier, an antenna switch, and so forth. The RFIC 30 generates a radio-frequency (RF) signal for radio transmission from an IQ signal (an I signal and a Q signal) output from the BBIC 40. As described later, the IQ signal is a signal of which the amplitude and the phase are represented in an IQ plane. The frequency of the RF signal ranges from about several hundred MHz to several GHz, for example.

In the RFIC 30, direct conversion of the IQ signal to the RF signal is not performed, but the IQ signal may be converted to an intermediate frequency (IF) signal, and the RF signal may be generated from the IF signal.

The BBIC 40 is a baseband integrated circuit that modulates an input signal, such as voice or data, on the basis of a modulation system, such as a high speed uplink packet access (HSUPA) system or a long term evolution (LTE) system, and outputs a modulation signal. In this embodiment, the modulation signal output from the BBIC 40 is output as an IQ signal. The frequency of the IQ signal ranges from about several MHz to several tens of MHz, for example.

The BBIC 40 detects an amplitude level of the modulation signal on the basis of the IQ signal and outputs a power-supply control signal (envelope signal) to the control circuit 20 so that the power-supply voltages $V_{cc1}$ and $V_{cc2}$ applied to the power amplifier circuit 10 reach a level corresponding to an amplitude level of the RF signal. That is, the BBIC 40 outputs a power-supply control signal to perform envelope tracking.

In the high-frequency module 1, a front-end circuit (not illustrated) may be provided between an output terminal of the power amplifier circuit 10 and the output terminal (Output) of the high-frequency module 1. The front-end circuit is a circuit that performs filtering on an amplified signal, switching of a reception signal received from the base station, and so forth. The amplified signal output from the front-end circuit is transmitted to the base station via the antenna (not illustrated) connected to the output terminal (Output) of the high-frequency module 1.

2. Configuration of Power Amplifier Circuit

Figure 3:
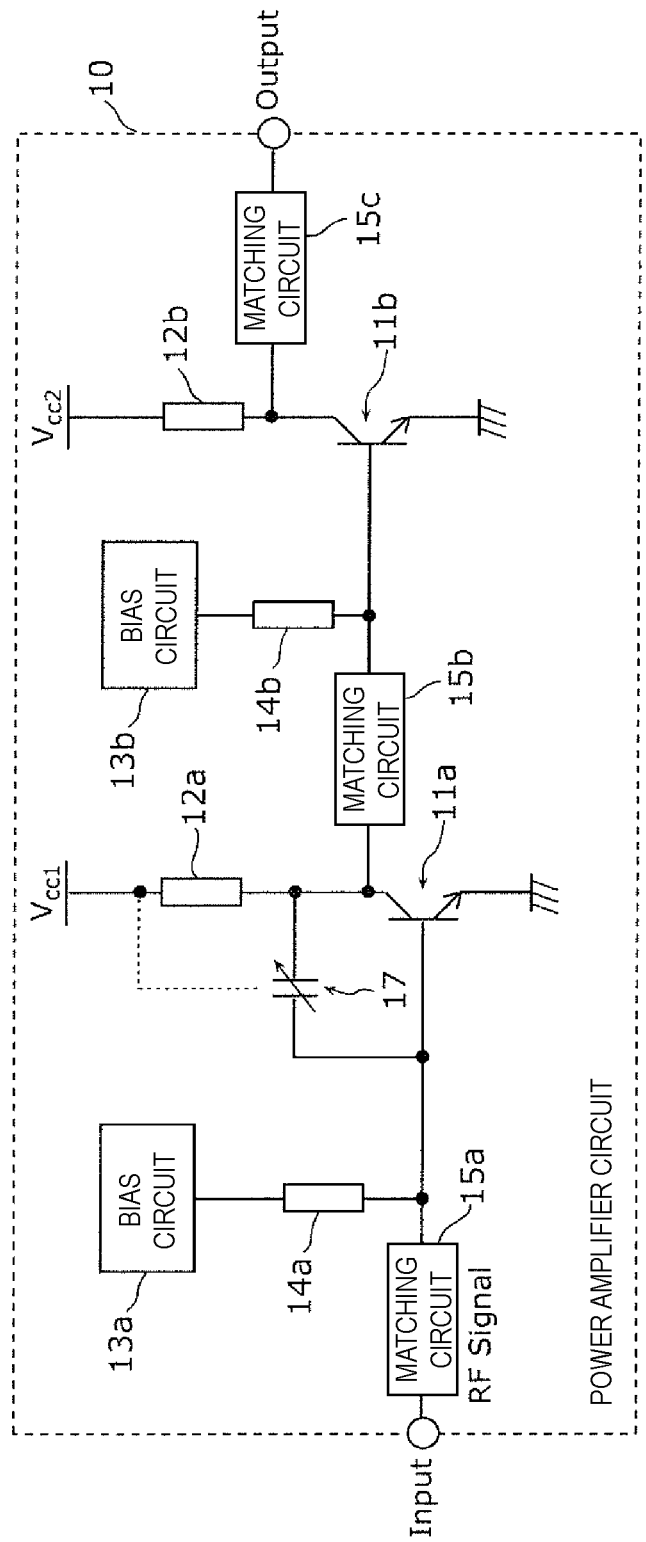
FIG. 3 is a conceptual diagram illustrating a configuration of a power amplifier circuit according to the first embodiment.

Here, a configuration of the power amplifier circuit 10 will be described in detail. FIG. 3 is a conceptual diagram illustrating the configuration of the power amplifier circuit 10 according to this embodiment.

As illustrated in FIG. 3, the power amplifier circuit 10 includes the transistors 11a and 11b, inductors 12a and 12b, bias circuits 13a and 13b, resistors 14a and 14b, matching circuits 15a, 15b, and 15c, and a variable capacitor 17. The power amplifier circuit 10 is constituted by a heterojunction bipolar transistor (HBT) chip, for example.

The transistors 11a and 11b are each constituted by an HBT, for example, and are each an amplifier element that amplifies the RF signal output from the RFIC 30.

The transistor 11a constitutes a common-emitter circuit that amplifies the RF signal input to a base using the power-supply voltage $V_{cc1}$. The matching circuit 15a is connected to the base of the transistor 11a, and the RF signal output from the matching circuit 15a is input to the base. Furthermore, the bias circuit 13a is connected to the base of the transistor 11a via the resistor 14a, and a predetermined bias voltage is superimposed on the RF signal output from the matching circuit 15a. The control circuit 20 is connected to a collector of the transistor 11a via the inductor 12a. The power-supply voltage $V_{cc1}$ controlled in accordance with an amplitude level of the RF signal is applied from the control circuit 20 to the collector of the transistor 11a. Furthermore, the collector of the transistor 11a is connected to a base of the transistor 11b via the matching circuit 15b. An emitter of the transistor 11a is connected to the ground.

The transistor 11b constitutes a common-emitter circuit that amplifies the RF signal input to the base using the power-supply voltage $V_{cc2}$. Like the transistor 11a, the matching circuit 15b is connected to the base of the transistor 11b, and the RF signal output from the matching circuit 15b is input to the base. Furthermore, the bias circuit 13b is connected to the base of the transistor 11b via the resistor 14b, and a predetermined bias voltage is superimposed on the RF signal output from the matching circuit 15b. The control circuit 20 is connected to a collector of the transistor 11b via the inductor 12b. The power-supply voltage $V_{cc2}$ controlled in accordance with an amplitude level of the RF signal is applied from the control circuit 20 to the collector of the transistor 11b. Furthermore, the collector of the transistor 11b is connected to the output terminal (Output) via the matching circuit 15c. An emitter of the transistor 11b is connected to the ground.

The bias circuits 13a and 13b are circuits that bias the respective transistors 11a and 11b to respective operating points. The bias circuits 13a and 13b are each constituted by a transistor, such as an HBT, for example.

The bias circuit 13a is connected between the base of the transistor 11a and the ground. For example, the battery voltage $V_{BAT}$ supplied from the battery of the terminal or the like into which the high-frequency module 1 is incorporated is applied, as a bias voltage, to a collector of a transistor, which is not illustrated, constituting the bias circuit 13a. An emitter of the transistor constituting the bias circuit 13a is connected to the base of the transistor 11a.

Similarly, the bias circuit 13b is connected between the base of the transistor 11b and the ground. For example, the battery voltage $V_{BAT}$ is applied, as a bias voltage, to a collector of a transistor constituting the bias circuit 13b. An emitter of the transistor constituting the bias circuit 13b is connected to the base of the transistor 11b.

The bias circuits 13a and 13b are not limited to the configuration described above, and any other configuration may be employed as long as circuits bias the respective transistors 11a and 11b to respective operating points.

The matching circuits 15a, 15b, and 15c are circuits that perform impedance matching for inputs and outputs of the transistors 11a and 11b. The matching circuits 15a, 15b, and 15c are each constituted by a capacitor and an inductor, for example.

The matching circuit 15a is provided on an input side of the transistor 11a and matches output impedance of the RFIC 30 to input impedance of the transistor 11a. The matching circuit 15b is provided on an input side of the transistor 11b, which is an output side of the transistor 11a, and matches output impedance of the transistor 11a to input impedance of the transistor 11b. The matching circuit 15c is provided on an output side of the transistor 11b and matches output impedance of the transistor 11b to input impedance of the output terminal of the power amplifier circuit 10. In the case where the high-frequency module 1 includes the front-end circuit (not illustrated), the matching circuit 15c matches input impedance of the front-end circuit to the output impedance of the transistor 11b.

Furthermore, the variable capacitor 17 is connected between the base and the collector of the transistor 11a. The variable capacitor 17 is a capacitor element whose capacitance value decreases when the power-supply voltage $V_{cc1}$ is increased. The variable capacitor 17 is connected between the base and the collector of the first-stage transistor 11a to which a radio frequency signal is first input among the transistors 11a and 11b of two stages.

The variable capacitor 17 may be, for example, a capacitor whose capacitance value is controlled by a control signal from the control circuit 20. Furthermore, a gain deviation in a linear gain region can be adjusted by the variable capacitor 17. Adjustment of a gain deviation in the linear gain region will be described in detail later. When the variable capacitor 17 is provided in the first-stage transistor 11a among multiple stages of transistors, a gain deviation in the linear gain region can be efficiently adjusted.

The power amplifier circuit 10 may include two stages of transistors each serving as an amplifier element as described above, or may include only a one-stage transistor. Furthermore, the power amplifier circuit 10 may include three or more stages of transistors. When the power amplifier circuit 10 includes multiple stages of transistors, the gain of an amplified radio-frequency signal output from the power amplifier circuit 10 can be increased further, and the linearity of the radio-frequency signal can be enhanced.

3. Operation of Power Amplifier Circuit

Figure 4A:
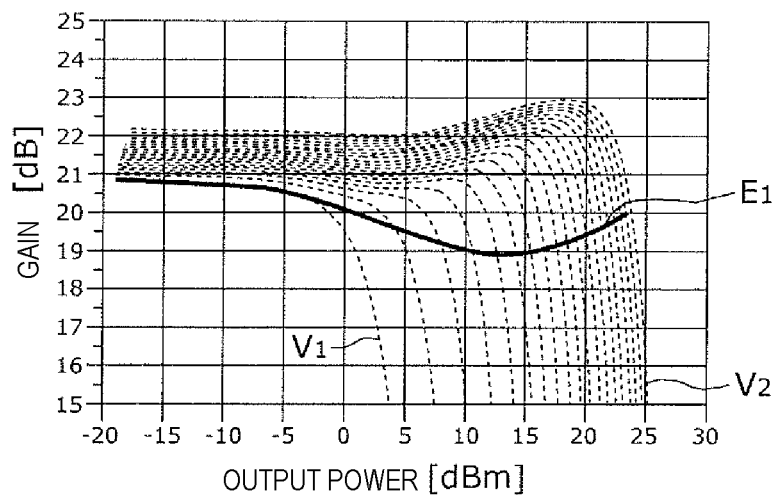
FIG. 4A illustrates an example of a relationship between output power and a gain of a transistor according to a comparative example.
Figure 4B:
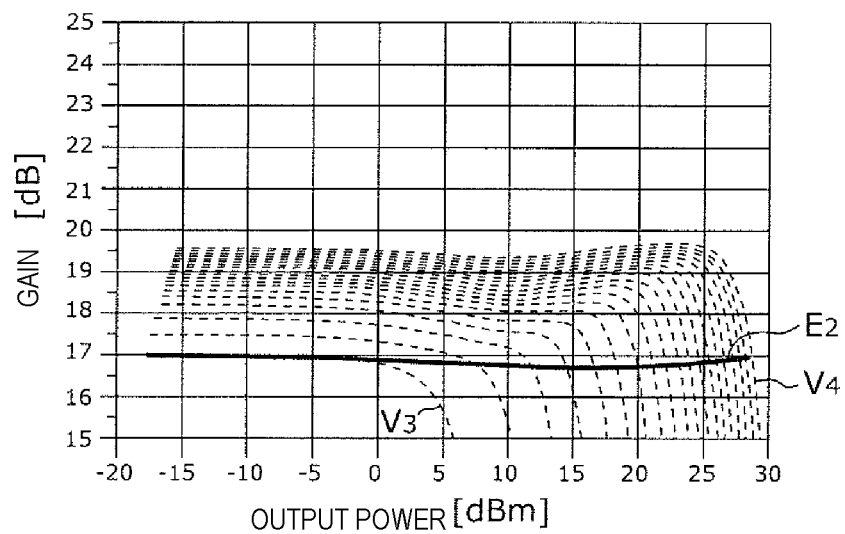
FIG. 4B illustrates an example of a relationship between output power and a gain of a transistor according to the first embodiment.
Figure 5:
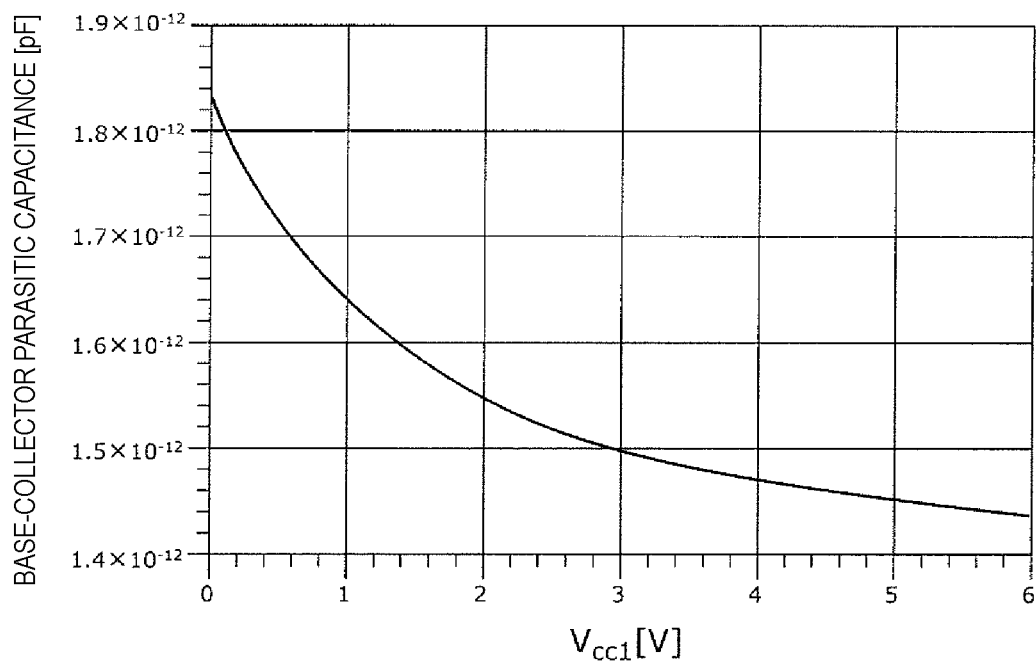
FIG. 5 illustrates an example of the relationship between a power-supply voltage and base-collector parasitic capacitance of the transistor.

Next, operation of the power amplifier circuit 10 will be described. FIG. 4A illustrates an example of a relationship between output power and a gain of a transistor according to a comparative example when an input voltage is swept. FIG. 4B illustrates an example of a relationship between output power and a gain of the transistor 11a according to this embodiment. FIG. 5 illustrates an example of the relationship between the power-supply voltage $V_{cc1}$ and base-collector parasitic capacitance $C_{bc}$ of the transistor 11a. Note that a power amplifier circuit according to the comparative example has a configuration in which the variable capacitor 17 is removed from the power amplifier circuit 10 according to this embodiment illustrated in FIG. 3.

FIGS. 4A and 4B each illustrate variation characteristics of collector voltage of the transistor 11a. In FIGS. 4A and 4B, the vertical axis represents gain obtained when input power is swept. The horizontal axis represents voltage output as $V_{cc1}$ (output voltage). Furthermore, in FIGS. 4A and 4B, a solid line represents an envelope signal (envelope line) during envelope tracking, and dashed lines represent gains obtained when an amplitude level of the power-supply voltage $V_{cc1}$ is changed from $V_1$ to $V_2$. In FIGS. 4A and 4B, a region in which a gain represented by a dashed line is substantially constant is called a linear gain region.

As illustrated in FIG. 4A, in the power amplifier circuit according to the comparative example, between the case where an amplitude level of the power-supply voltage $V_{cc1}$ (modulation signal) is low (for example, voltage $V_1$ in FIG. 4A) and the case where the amplitude level of the power-supply voltage $V_{cc1}$ is high (for example, voltage $V_2$ in FIG. 4A), a gain deviation obtained when the power-supply voltage $V_{cc1}$ is changed in the transistor 11a is small, and the linearity of an envelope line $E_1$ deteriorates as the amplitude level of the power-supply voltage $V_{cc1}$ increases.

On the other hand, as illustrated in FIG. 4B, in the transistor 11a according to this embodiment, during envelope tracking, an envelope line $E_2$ is a line connecting a level (PxdB) lower than an amplitude level of power when the power-supply voltage $V_{cc1}$ is a maximum voltage $V_4$ by about 3 dB, a level (PxdB) lower than that of power when the power-supply voltage $V_{cc1}$ is another voltage value by about the same extent (x dB) as this, and a linear gain obtained when an amplitude level of the power-supply voltage $V_{cc1}$ is $V_3$. That is, the envelope line $E_2$ is represented by a line close to a straight line as illustrated in FIG. 4B.

At this time, the larger a gain deviation in the linear gain region is, that is, the larger a difference between a gain obtained when the power-supply voltage $V_{cc1}$ is $V_4$ and a gain obtained when the power-supply voltage $V_{cc1}$ is $V_3$ is, the closer the envelope line $E_2$ comes to a straight line. The closer the envelope line $E_2$ is to a straight line, the more distortion of an amplified radio-frequency signal due to envelope tracking is reduced.

As described above, a gain deviation in the linear gain region is adjusted by the variable capacitor 17 whose capacitance varies according to the magnitude of the power-supply voltage $V_{cc1}$. Since the capacitance of the variable capacitor 17 decreases in response to an increase in the power-supply voltage $V_{cc1}$, the base-collector parasitic capacitance $C_{bc}$ of the transistor 11a is large when the power-supply voltage $V_{cc1}$ is low, and is small when the power-supply voltage $V_{cc1}$ is high, as illustrated in FIG. 5. Thus, in a graph illustrated in FIG. 5, as the power-supply voltage $V_{cc1}$ increases, the value of the parasitic capacitance $C_{bc}$ decreases so as to draw a downward curve to the right.

Furthermore, the larger the parasitic capacitance $C_{bc}$ is, the larger the amount of negative feedback applied to the transistor 11a is, and the gain of the transistor 11a is therefore reduced. This enables an increase in the gain deviation between the case where the power-supply voltage $V_{cc1}$ is low (for example, voltage $V_3$ in FIG. 4B) and the case where the power-supply voltage $V_{cc1}$ is high (for example, voltage $V_4$ in FIG. 4B).

Thus, as illustrated in FIG. 4B, an increase in the gain deviation can improve the linearity of the envelope line $E_2$ in comparison with the case where a gain deviation is small.

4. Effects

As described above, the power amplifier circuit 10 according to this embodiment enables an increase in the gain deviation in the linear gain region and an improvement in the linearity of a power-supply control signal (envelope signal) during envelope tracking. Thus, in the power amplifier circuit 10 and the high-frequency module 1, the linearity of high-frequency power gain and power efficiency can be improved.

Second Embodiment

Figure 6:
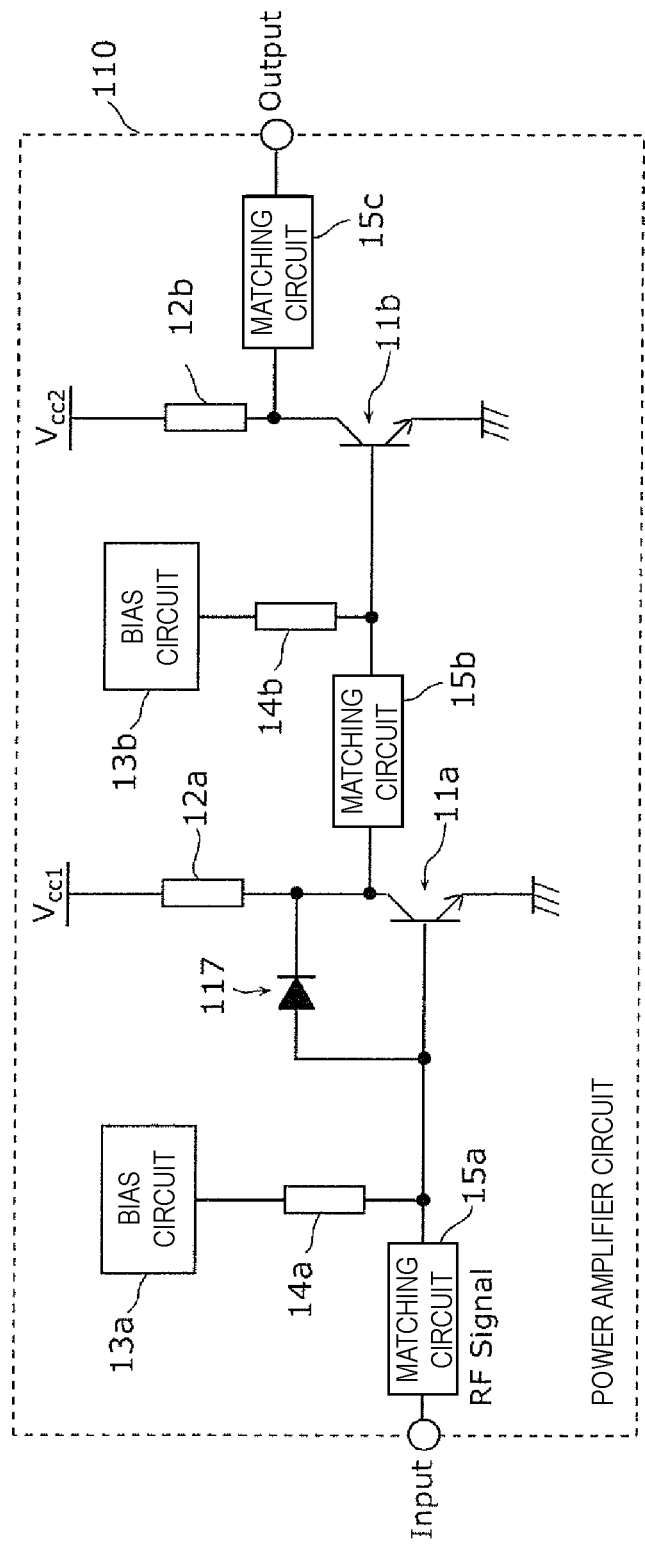
FIG. 6 is a conceptual diagram illustrating a configuration of a power amplifier circuit according to a second embodiment.

Next, a second embodiment will be described with reference to FIG. 6. FIG. 6 is a conceptual diagram illustrating a configuration of a power amplifier circuit 110 according to this embodiment.

The power amplifier circuit 110 according to this embodiment differs from the power amplifier circuit 10 according to the first embodiment in that a diode 117 is included as a variable capacitor.

As illustrated in FIG. 6, the power amplifier circuit 110 includes the transistors 11a and 11b, the inductors 12a and 12b, the bias circuits 13a and 13b, the resistors 14a and 14b, the matching circuits 15a, 15b, and 15c, and the diode 117. Configurations of the transistors 11a and 11b, the inductors 12a and 12b, the bias circuits 13a and 13b, the resistors 14a and 14b, and the matching circuits 15a, 15b, and 15c are the same as those in the power amplifier circuit 10 described in the first embodiment, and detailed descriptions thereof are omitted.

Here, like the variable capacitor 17 in the power amplifier circuit 10 described in the first embodiment, the diode 117 is connected between the base and the collector of the transistor 11a. An anode of the diode 117 is connected to the base of the transistor 11a. A cathode of the diode 117 is connected to the collector of the transistor 11a. That is, the diode 117 is connected in a direction in which an electric current can flow from the base side to the collector side of the transistor 11a.

Here, when the voltage on the collector side of the transistor 11a is higher than the voltage on the base side, a reverse voltage is applied to the diode 117. Thus, as a voltage applied to the collector of the transistor 11a increases, a negative voltage applied to the diode 117 increases, and a capacitance value of the diode 117 decreases. That is, as the power-supply voltage $V_{cc1}$ applied to the collector of the transistor 11a increases, the capacitance value of the diode 117 automatically decreases.

As just described, when the diode 117 is connected between the base and the collector of the transistor 11a, a capacitance value of the diode 117 automatically decreases in response to an increase in the power-supply voltage $V_{cc1}$ applied to the collector of the transistor 11a. Thus, when the diode 117 is used as a variable capacitor in the power amplifier circuit 110, the gain of the power amplifier circuit 110 can be easily adjusted, and a gain deviation in the linear gain region can be increased. This enables an improvement in the linearity of a power-supply control signal (envelope signal) during envelope tracking in the power amplifier circuit 110. Hence, in the power amplifier circuit 110 and a high-frequency module including the power amplifier circuit 110, the linearity of high-frequency power gain and power efficiency can be improved.

Third Embodiment

Figure 7:
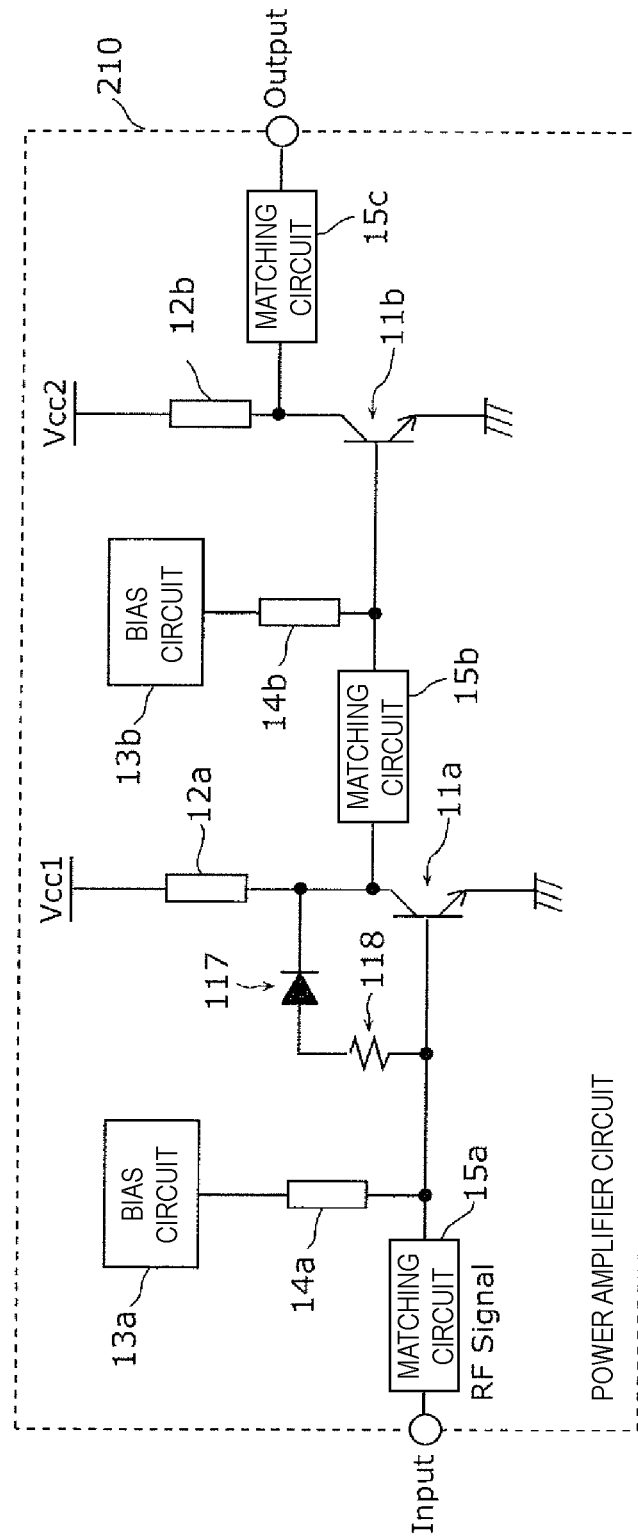
FIG. 7 is a conceptual diagram illustrating a configuration of a power amplifier circuit according to a third embodiment.

Next, a third embodiment will be described with reference to FIG. 7. FIG. 7 is a conceptual diagram illustrating a configuration of a power amplifier circuit 210 according to this embodiment.

The power amplifier circuit 210 according to this embodiment differs from the power amplifier circuit 10 according to the first embodiment in that a resistor connected in series with a variable capacitor is included. Furthermore, a diode is used as a variable capacitor in the power amplifier circuit 210.

As illustrated in FIG. 7, the power amplifier circuit 210 includes the transistors 11a and 11b, the inductors 12a and 12b, the bias circuits 13a and 13b, the resistors 14a and 14b, the matching circuits 15a, 15b, and 15c, the diode 117, and a resistor 118. Configurations of the transistors 11a and 11b, the inductors 12a and 12b, the bias circuits 13a and 13b, the resistors 14a and 14b, the matching circuits 15a, 15b, and 15c, and the diode 117 are the same as those in the power amplifier circuit 10 and the power amplifier circuit 110 respectively described in the first embodiment and the second embodiment, and detailed descriptions thereof are omitted.

As illustrated in FIG. 7, the resistor 118 is connected in series between the base of the transistor 11a and the diode 117. The resistor 118 is connected on an anode side of the diode 117. The resistor 118 may be connected on a cathode side of the diode 117.

Thus, when the resistor 118 is connected in series between the base of the transistor 11a and the anode of the diode 117, the amount of negative feedback applied to the transistor 11a can be finely adjusted. Hence, variations in the gain of high-frequency power due to variations in the power-supply voltage $V_{cc1}$ can be finely adjusted.

In this embodiment, although the diode 117 is used as a variable capacitor, a variable capacitor is not limited to the diode 117, and any other configuration may be employed as long as the capacitance of an element can be varied.

Other Embodiments

The present disclosure is not limited to the configurations described in the above-described embodiments. For example, as in a modification described below, a change may be appropriately made.

For example, a variable capacitor does not have to be a variable capacitor whose capacitance value varies in an analog fashion and may be a variable capacitor whose capacitance value varies in a digital fashion. For example, a configuration may be employed in which multiple capacitors having fixed values of capacitance are provided and switching between capacitance values is performed by a switch.

Furthermore, a variable capacitor may be a diode as described above, or any other configuration may be employed as long as the capacitance of an element can be varied.

Furthermore, in the above-described embodiments, in the case where there are provided multiple stages of transistors each serving as an amplifier element, a variable capacitor is connected between a base and a collector of a first-stage transistor to which a radio-frequency signal is first input. However, a transistor to which a variable capacitor is connected is not limited to the first-stage transistor, and a variable capacitor may be connected between a base and a collector of another transistor, or alternatively may be connected both between the base and the collector of the first-stage transistor and between a base and a collector of a transistor of a stage other than the first stage.

Furthermore, a capacitance value of a variable capacitor, and a resistance value of a resistor may be appropriately changed.

Furthermore, a control circuit may be provided separately from a power amplifier circuit, or alternatively may be included in the power amplifier circuit.

In addition, the present disclosure also contains an embodiment obtained by making various modifications found by a person skilled in the art to the above-described embodiments, or an embodiment implemented by freely combining components and functions in the above-described embodiments within the scope of the gist of the present disclosure.

The present disclosure can be applied to, for example, a mobile communication device (terminal), such as a cellular phone, and a base station that include a high-frequency module, a transmission device, and so forth including a power amplifier.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
an amplifier comprising at least one transistor, said amplifier being configured to amplify a radio-frequency signal inputted to a base of the at least one transistor and to output an amplified radio-frequency signal from a collector of the at least one transistor;
a diode and a resistor connected in series between the base of the at least one transistor and the collector of the at least one transistor;
a matching circuit connected to the base of the at least one transistor; and
a bias circuit connected between the matching circuit and a first end of the diode that is connected to the base of the at least one transistor, wherein a second end of the diode is connected to the collector of the at least one transistor, wherein a power-supply voltage that varies in accordance with an envelope of an amplitude of the radio-frequency signal is supplied to the collector of the at least one transistor, and wherein a capacitance value of the diode decreases as the power-supply voltage increases.

2. The power amplifier circuit according to claim 1, wherein the resistor is connected on one of an anode side or a cathode side of the diode.

3. The power amplifier circuit according to claim 1, wherein an anode of the diode is connected to the base of the at least one transistor, and wherein a cathode of the diode is connected to the collector of the at least one transistor.

4. The power amplifier circuit according to claim 1, wherein the power amplifier circuit comprises a plurality of amplification stages connected in series, and wherein the at least one transistor is part of a first amplification stage among the plurality of amplification stages.

5. A high-frequency module comprising:
a power amplifier circuit comprising:
   an amplifier comprising at least one transistor, said amplifier being configured to amplify a radio-frequency signal inputted to a base of the at least one transistor and to output an amplified radio-frequency signal from a collector of the at least one transistor;
   a variable capacitor connected between the base of the at least one transistor and the collector of the at least one transistor;
   a matching circuit connected to the base of the at least one transistor; and
   a bias circuit connected between the matching circuit and an end of the variable capacitor that is connected to the base of the at least one transistor,
   wherein a power-supply voltage that varies in accordance with an envelope of an amplitude of the radio-frequency signal is supplied to the collector of the at least one transistor, and
   wherein a capacitance value of the variable capacitor decreases as the power supply voltage increases; and
a radio-frequency integrated circuit (RFIC) configured to output the radio-frequency signal which is inputted to the base of the at least one transistor,
wherein the matching circuit is connected between the RFIC and the base of the at least one transistor.

6. The high-frequency module according to claim 5, further comprising a control circuit configured to control the power-supply voltage.

7. The high-frequency module according to claim 6, wherein the control circuit is an envelope tracking circuit configured to generate the power-supply voltage that varies in accordance with the envelope of the amplitude of the radio-frequency signal.

8. The power amplifier circuit according to claim 1, wherein the radio-frequency signal is outputted from the matching circuit and inputted to the base of the at least one transistor, and a predetermined bias voltage is superimposed on the radio-frequency signal outputted from the matching circuit.

9. The high-frequency module according to claim 1, further comprising a control circuit configured to control the power-supply voltage.

10. The high-frequency module according to claim 9, wherein the control circuit is an envelope tracking circuit configured to generate the power-supply voltage that varies in accordance with the envelope of the amplitude of the radio-frequency signal.

11. The power amplifier circuit according to claim 5, wherein the radio-frequency signal is outputted from the matching circuit and inputted to the base of the at least one transistor, and a predetermined bias voltage is superimposed on the radio-frequency signal outputted from the matching circuit.

* * * * *